United States Patent
Liu et al.

(10) Patent No.: US 11,226,561 B2
(45) Date of Patent: Jan. 18, 2022

(54) SELF-PRIMING RESIST FOR GENERIC INORGANIC HARDMASKS

(71) Applicant: INTERNATIONAL BUSINESS MACHINES CORPORATION, Armonk, NY (US)

(72) Inventors: Chi-Chun Liu, Altamont, NY (US); Indira Seshadri, Niskayuna, NY (US); Kristin Schmidt, Mountain View, CA (US); Nelson Felix, Slingerlands, NY (US); Daniel Sanders, San Jose, CA (US); Jing Guo, Niskayuna, NY (US); Ekmini Anuja De Silva, Slingerlands, NY (US); Hoa Truong, Santa Clara, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 809 days.

(21) Appl. No.: 16/101,411

(22) Filed: Aug. 11, 2018

(65) Prior Publication Data

US 2020/0050108 A1    Feb. 13, 2020

(51) Int. Cl.
*G03F 7/11* (2006.01)
*G03F 7/09* (2006.01)
*G03F 7/004* (2006.01)

(52) U.S. Cl.
CPC .............. *G03F 7/11* (2013.01); *G03F 7/0045* (2013.01); *G03F 7/094* (2013.01)

(58) Field of Classification Search
CPC . G03F 7/11; G03F 7/045; G03F 7/094; G03F 7/0045

USPC .................................................. 430/269-331
See application file for complete search history.

(56) References Cited

U.S. PATENT DOCUMENTS

| | | | |
|---|---|---|---|
| 7,291,427 B2 * | 11/2007 | Kawamura | G03F 7/165 430/15 |
| 7,560,222 B2 | 7/2009 | Chen et al. | |
| 8,093,177 B2 | 1/2012 | Hamers et al. | |
| 8,124,485 B1 | 2/2012 | Goldfarb et al. | |
| 8,728,714 B2 | 5/2014 | Millward | |
| 9,099,486 B2 | 8/2015 | Merz et al. | |

(Continued)

OTHER PUBLICATIONS

Ciampi, S. et al., "Functionalization of Acetylene-Terminated Monolayers on Si(100) Surfaces: A Click Chemistry Approach"; Langmuir (2007); vol. 23, pp. 9320-9329.

(Continued)

*Primary Examiner* — Duane Smith
*Assistant Examiner* — Nicholas E Brown
(74) *Attorney, Agent, or Firm* — Intelletek Law Group, PLLC; Gabriel Daniel, Esq.

(57) ABSTRACT

A self-priming resist may be formed from a first random copolymer forming a resist and a polymer brush having the general formula poly(A-r-B)-C-D, wherein A is a first polymer unit, B is a second polymer unit, wherein A and B are the same or different polymer units, C is a cleavable unit, D is a grafting group and r indicates that poly(A-r-B) is a second random copolymer formed from the first and second polymer units. The first random copolymer may be the same or different from the second random polymer. The self-priming resist can create a one-step method for forming an adhesion layer and resist by using the resist/brush blend.

19 Claims, 4 Drawing Sheets

(56) References Cited

U.S. PATENT DOCUMENTS

| | | |
|---|---|---|
| 9,123,541 B2 | 9/2015 | Xu et al. |
| 9,293,328 B2 | 3/2016 | Millward |
| 9,576,817 B1* | 2/2017 | Cheng .................. G03F 7/0002 |
| 10,345,702 B2* | 7/2019 | Glodde ................. G03F 7/2006 |
| 2011/0223390 A1 | 9/2011 | Hanawa et al. |
| 2012/0116007 A1* | 5/2012 | Gopalan ............. C08F 293/005 |
| | | 524/529 |
| 2013/0127021 A1* | 5/2013 | Millward ............ H01L 21/0338 |
| | | 257/632 |
| 2017/0194196 A1 | 7/2017 | Brink et al. |

OTHER PUBLICATIONS

De Benedetti, W. J. I. et al., "Functionalization of Oxide-Free Silicon Surfaces", JVSTA (2013); vol. 31:5; pp. 050826-1-050826-18.

Edwards, E. W. et al., "Precise Control over Molecular Dimensions of Block-Copolymer Domains Using the Inerfacial Energy of Chemically NanoPatterned Substrates"; Advanced Materials (2004); vol. 16:15; pp. 1315-1319.

Hanisch, A. et al., "Phosphonic Acid-Functionalized Diblock Copolymer Nano-Objects via Polymerization-Induced Self-Assembly: Synthesis, Characterization, and Occlusion into Calcite Crystals"; Macromolecules (2016); vol. 49; pp. 192-204.

Mansky, P. et al., "Controlling Polymer-Surface Interactions with Random Copolymer Brushes"; Science (1997); vol. 275; pp. 1458-1460.

Van Den Brand, J. et al., "Improving the Adhesion Between Epoxy Coatings and Aluminium Substrates"; Progress in Organic Coatings (2004); vol. 51; pp. 339-350.

* cited by examiner

SELF-PRIMING RESIST FOR GENERIC INORGANIC HARDMASKS

BACKGROUND

Technical Field

The present disclosure generally relates to resists for hardmasks, and more particularly, to a self-priming resist that provides an adhesion layer and resist by using a resist/polymer brush blend.

Description of the Related Art

For extreme ultraviolet (EUV) lithography with a tight pitch, resist height/etch budget is limited in order to avoid pattern collapse. Moreover, the thickness of the immediate underlying hardmask, e.g., the silicon antireflective coating (SiARC), needs to be scaled as well. While spin-on materials such as SiARC typically cannot meet the uniformity requirement as the thickness goes below 10 nm, hardmask materials deposited by chemical vapor deposition (CVD) or atomic layer deposition (ALD) can provide high quality thin films. However, many hardmask materials do not provide sufficient adhesion for EUV resist. An adhesion layer, such as a bottom antireflective coating (BARC) or a polymer brush, is used for most of the cases. Decoupling the adhesion layer from the hardmask may also be desirable in some cases, such as for 193i lithography.

SUMMARY

According to an embodiment of the present disclosure, a self-priming resist includes a first random copolymer forming a resist and a polymer brush having the general formula poly(A-r-B)-C-D, wherein A is a first polymer unit, B is a second polymer unit, wherein A and B are the same or different polymer units, C is a cleavable unit, D is a grafting group, and r indicates that poly(A-r-B) is a second random copolymer formed from the first and second polymer units.

In some embodiments, the polymer brush further includes a performance control group controlling the segregation of the polymer brush molecules in the z-direction when the resist/brush blend is coated onto a substrate. In some embodiments, the performance control group is positioned between the cleavable unit and the grafting group. In other embodiments, the performance control group is positioned between the second random copolymer and the cleavable unit.

In some embodiments, the grafting group is selected to graft to a hardmask material at a temperature near or below the typical post-apply bake temperature of the resist. In certain embodiments, the grafting group is an amine group.

In some embodiments, the cleavable group is cleavable from the second random copolymer by one of a photoacid, a base, and a photon.

In some embodiments, the polymer brush is present in a concentration of less than one weight percent in the resist, typically from about 0.1 to about 0.9 weight percent.

According to another embodiment of the present disclosure, a method for providing an etch on a substrate includes disposing a self-priming resist on the substrate. The self-priming resist includes a first random copolymer forming a resist and a polymer brush having the general formula poly(A-r-B)-C-D, wherein A is a first polymer unit, B is a second polymer unit, wherein A and B are the same or different polymer units, C is a cleavable unit, D is a grafting group, and r indicates that poly(A-r-B) is a second random copolymer formed from the first and second polymer units. The grafting group is caused to graft to the substrate by subjecting the self-priming resist and the substrate to the typical post applied bake temperature of the resist. The self-priming resist and the substrate are exposed to an ultraviolet lithography light source to result in an exposed product. The exposed product is developed to remove the resist and the polymer brush that was exposed.

In some embodiments, the method further includes controlling a segregation of the second random copolymer in a z-direction by including a performance control group in the polymer brush, wherein the performance control group is positioned either between the cleavable unit and the grafting group or between the second random copolymer and the cleavable unit.

In some embodiments, the method further includes cleaving the cleavable group from the second random copolymer by one of a photoacid, a base, and a photon.

The techniques described herein may be implemented in a number of ways. Example implementations are provided below with reference to the following figures.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

DETAILED DESCRIPTION

Figure 1:
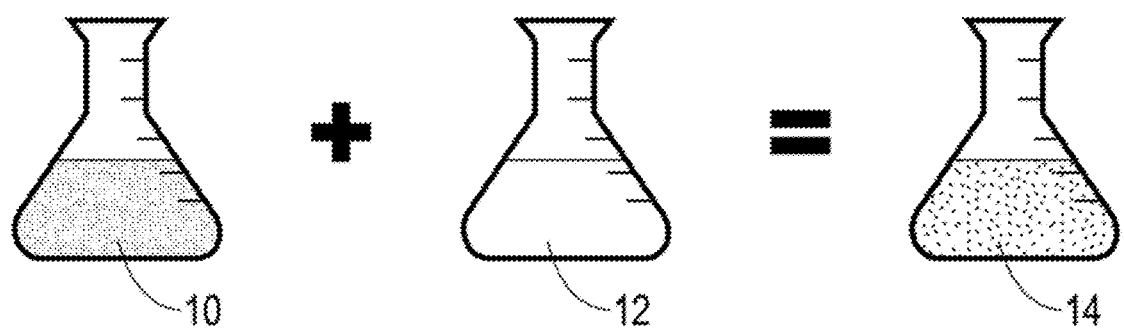
FIG. 1 is a pictorial representation of the preparation of a self-priming resist composition according to an exemplary embodiment of the present disclosure.

In the following detailed description, numerous specific details are set forth by way of examples in order to provide a thorough understanding of the relevant teachings. However, it should be apparent that the present teachings may be practiced without such details. In other instances, well-known methods, procedures, components, and/or circuitry have been described at a relatively high-level, without detail, in order to avoid unnecessarily obscuring aspects of the present teachings.

The present disclosure generally relates to compositions and methods for forming an adhesion layer and resist in a single step by using a resist/polymer brush blend. The present disclosure further generally relates to a polymer brush design that may be chemically compatible with the resist, that may graft at a low temperature, such as those seen in the post-applied bake, and that may be cleavable along with the resist during development.

Polymer brush layers may be used to improve the adhesion between a resist and various types of hardmasks, such as atomic layer deposition (ALD), silicon nitride (SiN), ALD-Ox, ALD TiOx, and the like. Conventional processes include an additional spin-coating, bake and solvent rinsing to form the adhesion promoter layer. One approach to improve the adhesion between a resist and a hardmask may include adding a new functionality onto the resist itself. However, given the complexity of existing resist systems, adding new functionality may aggravate the stochastic effect and roughness.

A polymer brush may be formed as a random copolymer of two or more components, A and B, plus a functional group, D, at one end. Components A and B can be used for surface energy control and functional group D (also referred to as end group D) may be used for surface binding. Polymer brushes may include end chain functionalized polymers, as represented by Formula (I), below, and side-chain functionalized polymers, as represented by Formula (II), below.

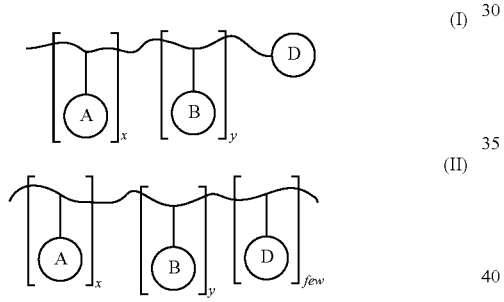

Additional components may be added onto the side chain to control grafting behavior, surface properties, etch behavior, n/k value, and the like. Polymer brush grafting is self-limiting, as only one mono-layer of polymer can be grafted because there is only one grafting group per chain. In some embodiments, process temperature, grafting density, kinetics, surface selectivity, and the like, can be optimized by choosing certain grafting groups. For example, one polymer brush may graft faster on TiN than an organic planarization layer (OPL) at certain temperatures.

Broadly, embodiments of the present disclosure provide a simplified, one-step method for forming an adhesion layer and resist by using a resist/polymer brush blend. Instead of modifying the resist molecular structure by adding a grafting functionality, a separate resist-like polymer brush may be synthesized and blended with the resist. Typically, a very thin layer of brush is used for adhesion improvement. Therefore, a very low brush content, as described in greater detail below, may be used in the blend system, which can help avoid potential resolution and line edge roughness (LER) issues.

Embodiments of the present disclosure provide a polymer brush that includes one or more of the following features. The polymer brush can be chemically compatible with the resist so that the brush/resist composition can be applied in one step without additional rinsing. The polymer brush can graft at a low temperature. Typically, the grafting and adhesion improvement can be done directly at the post-applied bake (PAB). An optional cleavable group can be provided near the grafting point so that the majority of the brush in the exposed area can be removed along with the exposed resist during development. This can help facilitate pattern transfer. The cleavage of the brush can be accomplished by various methods, such as photosensitive methods, acid catalysis/hydrolysis methods and basic catalysis/hydrolysis methods, as described in greater detail below.

The polymer brush/resist composition according to embodiments of the present disclosure can result in high throughput with less material and solvent use as compared to conventional methods. Moreover, the compositions and methods of the present disclosure are relatively easy to maintain in terms of material and tool setup. The use of a resist/brush composition, according to embodiments of the present disclosure, instead of modifying the resist can simplify the synthesis work and decouple the molecular designs while avoiding unnecessary interactions. The optionally cleavable group provided in the resist/brush composition according to embodiments of the present disclosure can partially or fully remove the polymer brush at exposed areas for etch simplification.

Referring now to FIGS. 1 through 4, a resist 10 may be a solution of a random copolymer of A and B, as illustrated by formula (III) below. The random polymer may be AABABBBBABAA, for example. More polymer units can be included as needed.

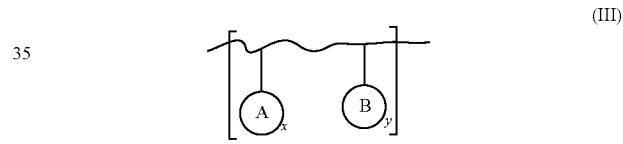

In some embodiments, polymer units A and B can be a styrene polymer, for example. Of course, other polymers, as may be known in the art, are contemplated within the scope of the present disclosure. In some embodiments, polymer unit A may be a photoacid generator which is photosensitive to the desired lithography tool and wavelength.

Figure 3:
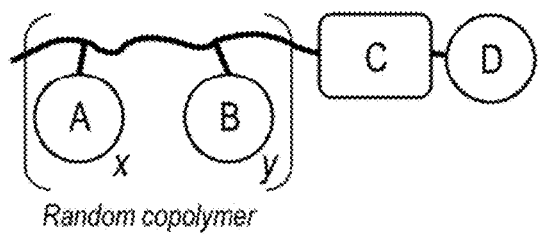
FIG. 3 is a representation of a polymer brush design usable in the self-priming resist composition of FIG. 1.

As shown in FIG. 3, a polymer brush 12 may be made based on the chemical structure of a resist, e.g. a random copolymer A and B, along with cleavable unit C and a grafting end group D, as illustrated in Formula (IV) below.

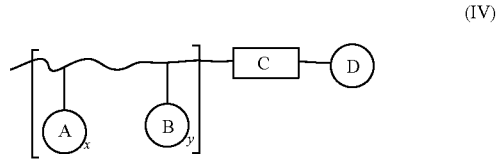

Polymer units A and B may form a random copolymer of polymer units A and B. The random copolymer may be designated as poly(A-r-B), where r designates that A and B form a random copolymer. In some embodiments, polymer units A and B of the polymer brush 12, as shown in Formula (IV), may be the same as the polymers of the resist of Formula (III). However, polymer units A and B may each independently be the same or different from those of the resist of Formula (III). Subscripts x and y of polymer brush 12 may be the same or different from subscripts x and y of the resist 10. Typically, the random copolymer of the polymer brush may be optimized for good adhesion to the resist and enable good patterning performance.

Cleavable unit C may be a cleavable unit which may be polymeric or monomeric in nature. Cleavable unit C may undergo cleavage reactions induced by one or more of the following: photocleavage by EUV photons (or secondary electrons), reaction catalyzed by a photoacid in the exposed regions, or base-catalyzed reactions occurring during the development process.

Polymer unit D may be a reactive end-group that can graft to a substrate surface. In some embodiments, reactive end-group D is amine (—$NH_2$) based so the grafting can be performed near or below 100° C.

Figure 4:
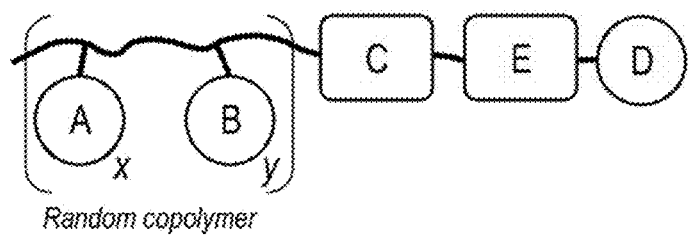
FIG. 4 is a representation of a polymer brush design, including an optional performance control group, usable in the self-priming resist composition of FIG. 1.

In some embodiments, as shown in FIG. 4, an additional segment E (also referred to as performance control group E) may be present, as illustrated by Formula (V), below. Segment E can serve to improve the performance of the brush by assisting segregation to the substrate interface, for example. The relative positions of cleavable unit C and segment E can be reversed from the arrangement shown in Formula (V).

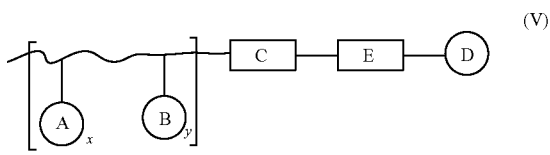

(V)

Figure 2:
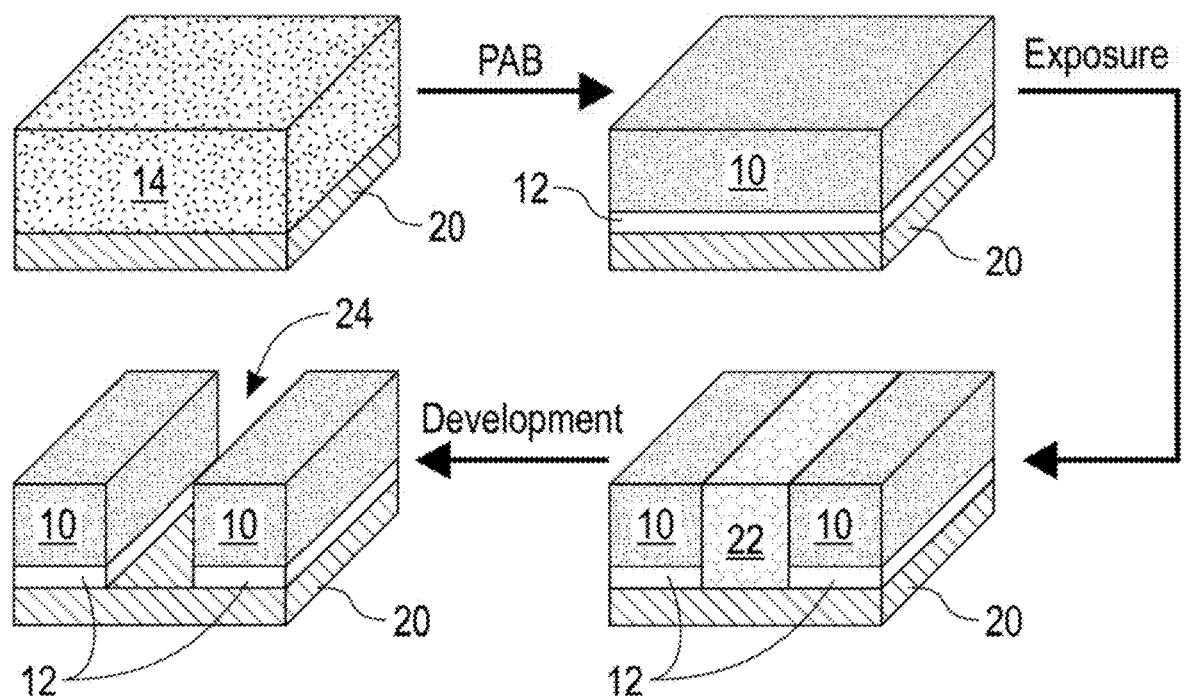
FIG. 2 is a schematic representation of a process for using the self-priming resist composition of FIG. 1.

The resist 10 and the polymer brush 12 may be combined to form a self-priming resist 14 (also referred to as resist/brush blend 14 or resist/brush composition 14). As shown in FIG. 2, the self-priming resist 14 may be applied to a hardmask 20 and subjected to a post applied bake (PAB). The PAB temperature may be selected to be the typical processing temperature of the resist but greater than the grafting temperature, causing the polymer brush 12 to graft to the hardmask 20. An exposed resist region 22 may be formed after exposure. Following development, a trace 24 may be formed, where a majority of the brush may be developed. Thus, etch difficulty, if any, may be greatly alleviated.

Figure 5:
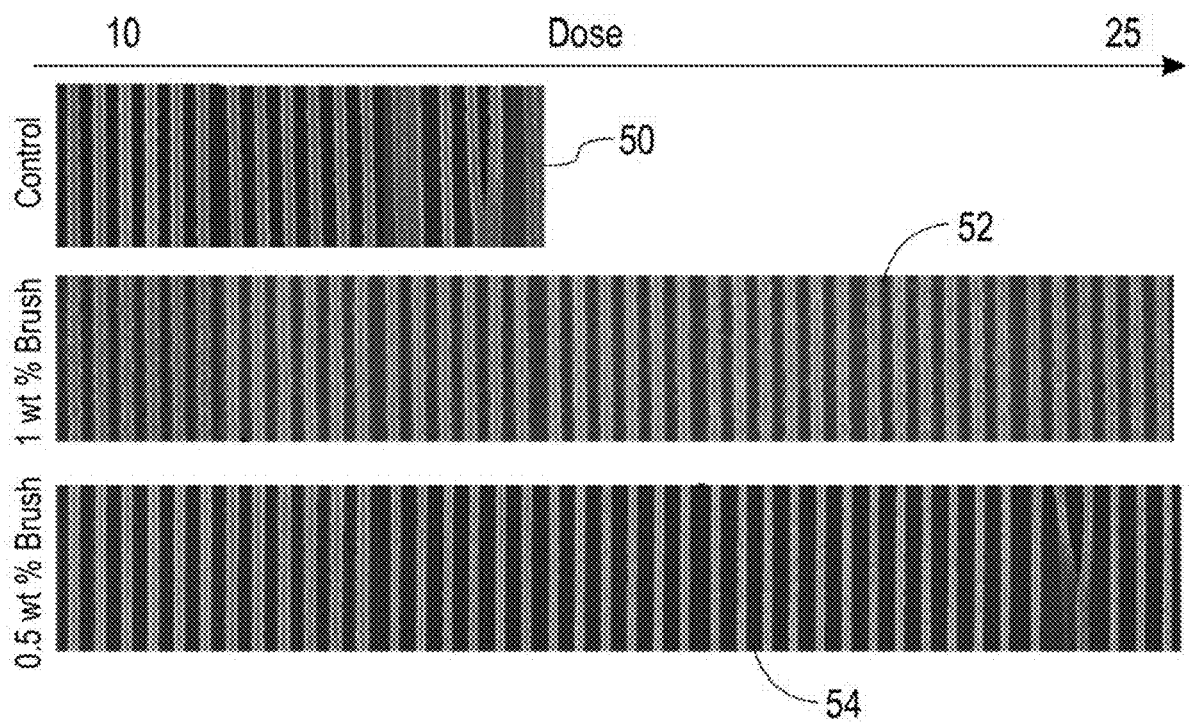
FIG. 5 is a detailed view of a 50 nm L/S pattern, illustrating the effects of the self-priming resist composition of FIG. 1 used in the process of FIG. 2.

Referring now to FIG. 5, there are shown three traces—a control trace 50, a 1 wt. % brush trace 52 and a 0.5 wt. % brush trace 54. The traces are a 50 nm L/S pattern using a 2073 resist and a polystyrene (PS) —$NH_2$ brush. The developer was tetramethylammonium hydroxide (TMAH). Exposure of 193 nm was provided with an interference lithography tool. The control trace 50 shows a pattern collapse at dose of 13.8 mJ with a critical dimension (CD) of 51 nm. Trace 52 was performed with a concentration of the polymer brush 12 of one weight percent. In the trace 52, no pattern collapse was found up to a dose up to 25 mJ, however the excess brush in the resist/brush blend system compromises the resist performance and results in an increase in line edge roughness and residues. Finally, trace 54, using a 0.5 weight percent concentration of the polymer brush 12 results in a pattern collapse around the dose of 23.2 mJ with a critical dimension of 36 nm, which is much improved compared to control experiment 50. In this embodiment, the lower content of the polymer brush in the system did not affect the lithography performance and provided comparable line edge roughness as observed in the control trace 50.

Accordingly, in some embodiments, the polymer brush 12 may be present in a concentration of less than 1 weight percent in the resist/brush blend 14. In some embodiments, the concentration of the polymer brush 12 in the blend 14 may be much lower than 0.5 wt % by incorporating the segregation functional group E described earlier in Formula V. In other embodiments, the concentration of the polymer brush 12 in the resist blend 14 may be from about 0.1 to about 0.9 weight percent.

Figure 6:
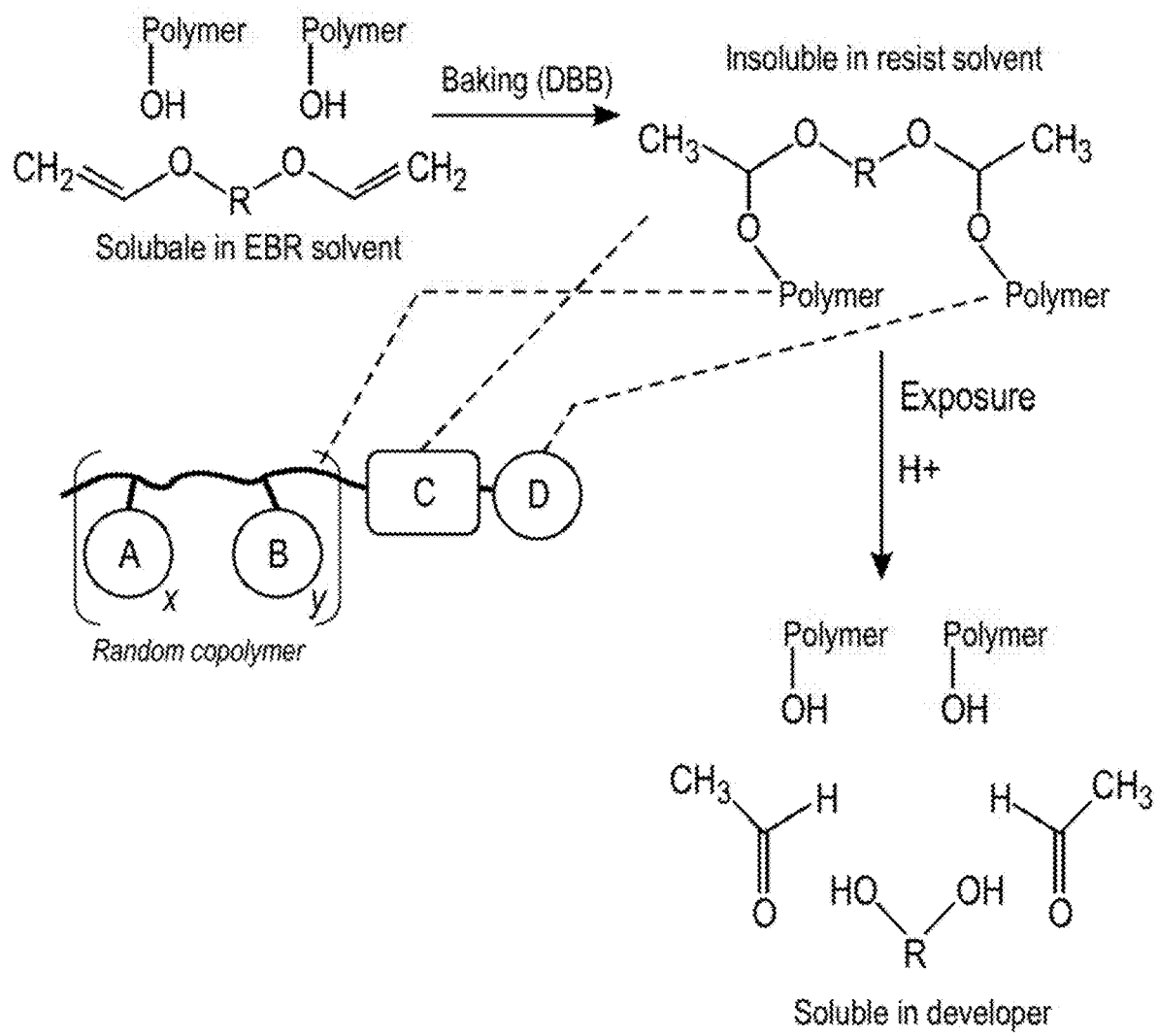
FIG. 6 is a chemical process representation of photoacid cleavage of the polymer brush of FIGS. 4 and 5.
Figure 7:
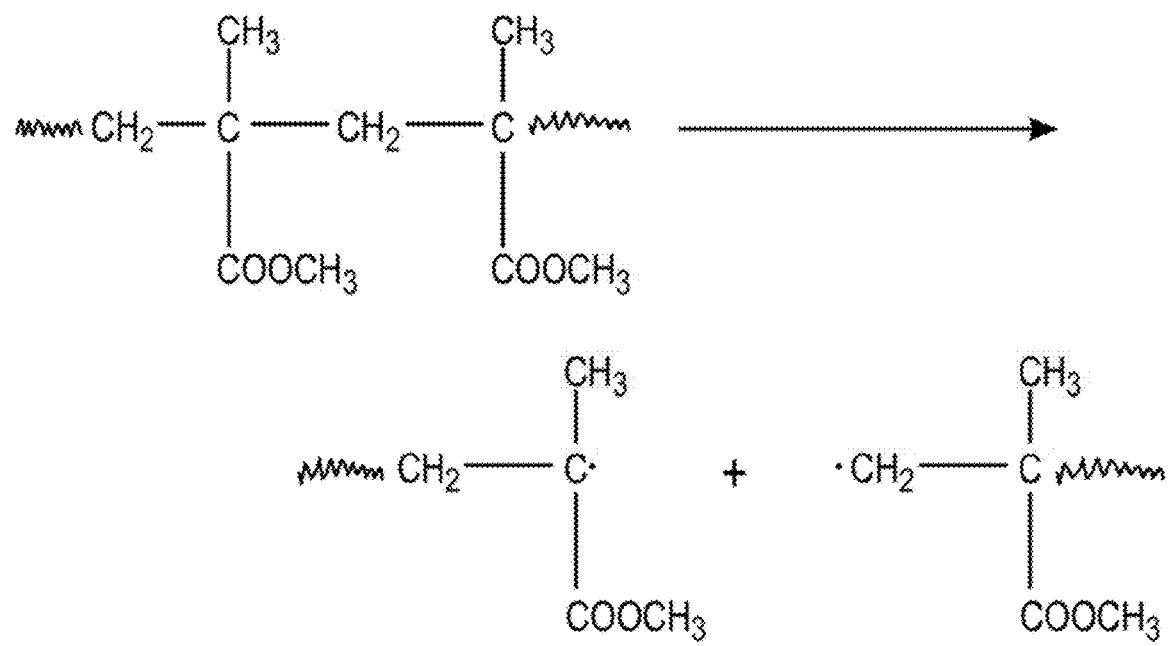
FIG. 7 is a chemical process representation of a photo-cleavable linkage used in the polymer brush of FIGS. 4 and 5.
Figure 8:
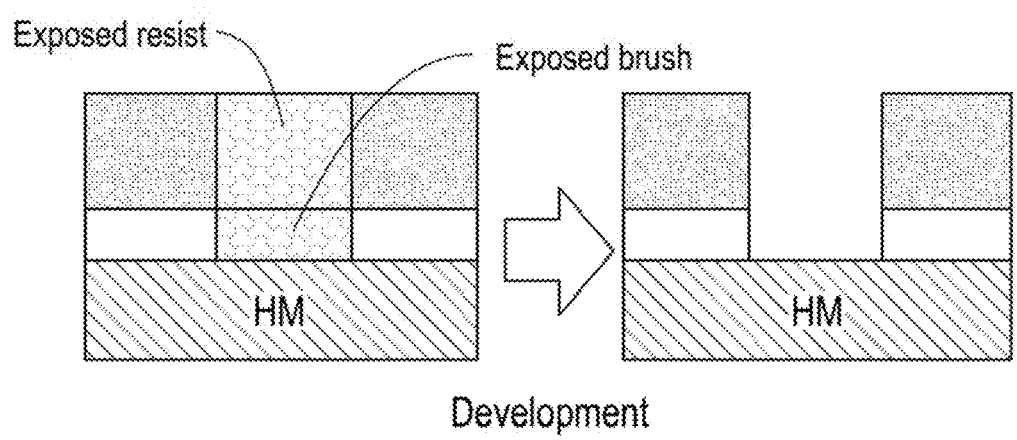
FIG. 8 is an illustration representing cleaving of the polymer brush by a developer.

Referring now to FIGS. 6 through 8, there are shown exemplary embodiments for the design of the cleavable unit C, as described above. Referring specifically to FIG. 6, there is shown a cleavable unit C that is cleavable by photoacid. This cleavable group may be similar to that used in developable BARC (DBARC), for example. FIG. 6 illustrates, by dashed lines, where the various elements may be found in the general structure of the polymer brush 12 of FIG. 3. Examples of acid-cleavable units include, without limitation, acetals, ketals, polyphthalaldehydes, orthoesters, tertiary esters, and the like. Thus, the R-group in FIG. 6 may be selected to form one of these acid-cleavable units.

Referring to FIG. 7, there is shown a cleavable unit C that is cleavable by a photon. In this embodiment, a segment of poly(methyl methacrylate) (PMMA) may be used as cleavable unit C. PMMA is known as a positive tone photoresist of e-beam and EUV. Photodegradation of the cleavable unit C may occur upon exposure. Photocleavable linkages may be based on, for example, ortho-nitrobenzyl esters for 248 nm lithography.

Referring to FIG. 8, there is shown a cleavable unit C that is base cleavable, or that may be cleaved by the developer. During development, the exposed resist and exposed brush may be removed. In this approach, development conditions may need to be controlled to avoid undercut, or removal of the polymer brush under the unexposed resist. Examples of base cleavable groups include phenoxyacteyl linkages. In some embodiments, carbonate linkages may be useful, however, their relatively slow hydrolysis may not be fast enough for certain development conditions.

CONCLUSION

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A polymer brush, comprising:
 a compound having a general formula poly (A-r-B)-C-D, wherein:
  A is a first polymer unit;
  B is a second polymer unit;
  C is a cleavable unit;
  D is a grafting group; and
  r indicates that poly(A-r-B) is a random copolymer of A and B and
 a performance control group controlling a segregation of the random copolymer of A and B in a z-direction.

2. The polymer brush of claim 1 wherein the performance control group is positioned between the cleavable unit and the grafting group.

3. The polymer brush of claim 1 wherein the performance control group is positioned between the random copolymer of A and B and the cleavable unit.

4. The polymer brush of claim 1, wherein the grafting group is selected to graft to a hardmask material at a temperature near or below a post-apply bake temperature of a photoresist.

5. The polymer brush of claim 1, wherein the grafting group is an amine group.

6. The polymer brush of claim 1, wherein the cleavable group is cleavable from the random copolymer of A and B by one of a photoacid, a base, and a photon.

7. The polymer brush of claim 6, wherein the base is a developer.

8. A self-priming resist comprising:
 a first random copolymer forming a photoresist; and
 a polymer brush having the general formula poly(A-r-B)-C-D, wherein:
  A is a first polymer unit;
  B is a second polymer unit;
  C is a cleavable unit;
  D is a grafting group; and
  r indicates that poly(A-r-B) is a second random copolymer formed from the first and second polymer units.

9. The self-priming resist of claim 8, wherein the polymer brush further comprises a performance control group controlling the segregation of the random copolymer of A and B in the z-direction.

10. The self-priming resist of claim 9, wherein the performance control group is positioned between the cleavable unit and the grafting group.

11. The self-priming resist of claim 9, wherein the performance control group is positioned between the second random copolymer and the cleavable unit.

12. The self-priming resist of claim 8, wherein the grafting group is selected to graft to a hardmask material at a temperature near or below a post apply bake temperature of the photoresist.

13. The self-priming resist of claim 8, wherein the grafting group is an amine group.

14. The self-priming resist of claim 8, wherein the cleavable group is cleavable from the second random copolymer by one of a photoacid, a base, and a photon.

15. The self-priming resist of claim 8, wherein the polymer brush is present in a concentration of less than one weight percent in the self-priming resist.

16. A method for providing an etch on a substrate comprising:
 disposing a self-priming resist on the substrate, the self-priming resist comprising:
  a first random copolymer forming a resist; and
  a polymer brush having the general formula poly(A-r-B)-C-D, wherein
   A is a first polymer unit;
   B is a second polymer unit;
   C is a cleavable unit;
   D is a grafting group; and r indicates that poly(A-r-B) is a second random copolymer formed from the first and second polymer units;

causing the grafting group to graft to the substrate;

exposing the self-priming resist and the substrate to an ultraviolet lithography light source to result in an exposed product; and developing the exposed product to remove the resist and the polymer brush that was exposed.

17. The method of claim 16, further comprising controlling the segregation of the second random copolymer in the z-direction by including a performance control group in the polymer brush, wherein the performance control group is positioned either between the cleavable unit and the grafting group or between the second random copolymer and the cleavable unit.

18. The method of claim 16, wherein the grafting group is an amine group.

19. The method of claim 16, further comprising cleaving the cleavable group from the second random copolymer by one of a photoacid, a base, and a photon.

\* \* \* \* \*